(12) United States Patent
Liao et al.

(10) Patent No.: US 12,463,067 B2
(45) Date of Patent: Nov. 4, 2025

(54) PICKUP APPARATUS AND METHOD OF USING THE SAME

(71) Applicant: Taiwan Semiconductor Manufacturing Company, Ltd., Hsinchu (TW)

(72) Inventors: Jen-Chun Liao, Taipei (TW); Ching-Hua Hsieh, Hsinchu (TW); Chih-Wei Lin, Hsinchu County (TW); Hsiao-Chung Liang, Hsinchu (TW); Ying-Jui Huang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 429 days.

(21) Appl. No.: 18/180,131

(22) Filed: Mar. 8, 2023

(65) Prior Publication Data

US 2024/0304474 A1  Sep. 12, 2024

(51) Int. Cl.
*H01L 21/67* (2006.01)
*H01L 21/683* (2006.01)

(52) U.S. Cl.
CPC .... *H01L 21/67132* (2013.01); *H01L 21/6836* (2013.01); *H01L 2221/68386* (2013.01)

(58) Field of Classification Search
CPC ........... H01L 21/67132; H01L 21/6836; H01L 2221/68386
USPC ......................................... 156/709
See application file for complete search history.

(56) References Cited

U.S. PATENT DOCUMENTS

2022/0406627 A1* 12/2022 Chen ................. H01L 21/67115

* cited by examiner

*Primary Examiner* — James D Sells
(74) *Attorney, Agent, or Firm* — JCIPRNET

(57) ABSTRACT

A pickup apparatus for separating a semiconductor package from an adhesive film includes a platform, a roller, a moving mechanism, and a collector element. The platform has a surface disposed with the adhesive film, where the adhesive film is disposed between the platform and the semiconductor package. The roller is disposed inside the platform and under the adhesive film, where the roller includes a body and a plurality of protrusions distributed over the body. The moving mechanism is connected to the roller to control a movement of the roller. The collector element is disposed over the platform and the adhesive film, where the collector element is configured to remove the semiconductor package from the adhesive film.

20 Claims, 20 Drawing Sheets

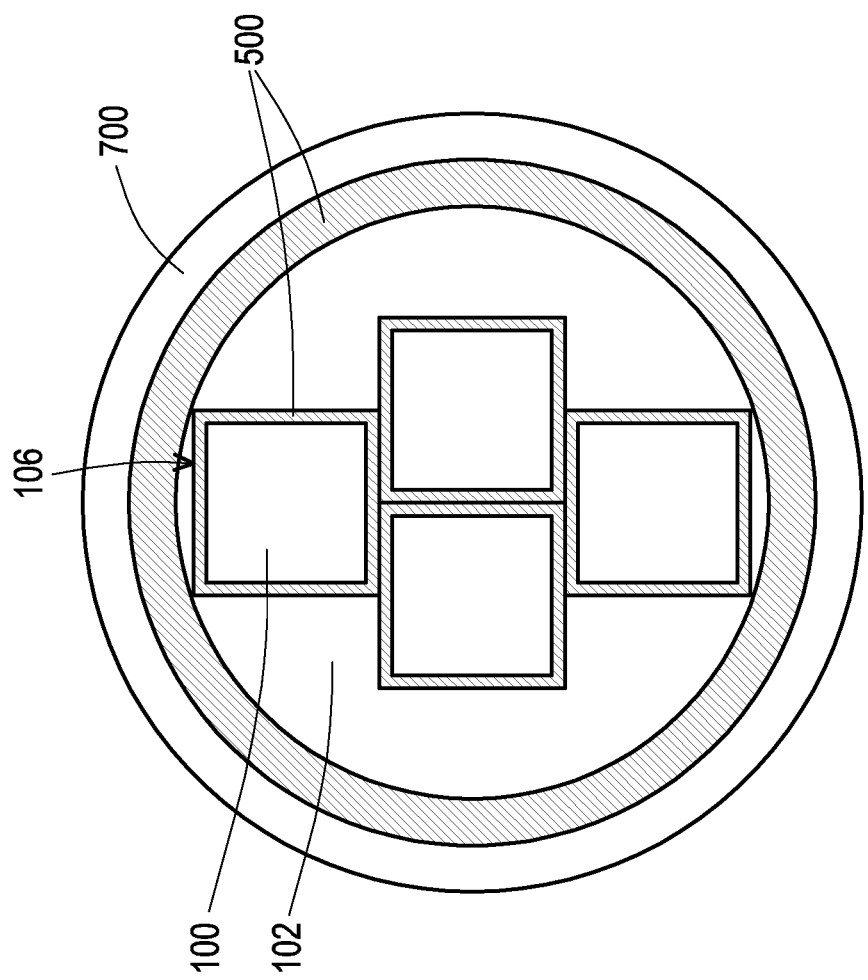
FIG. 7
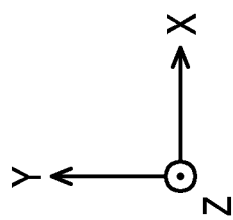

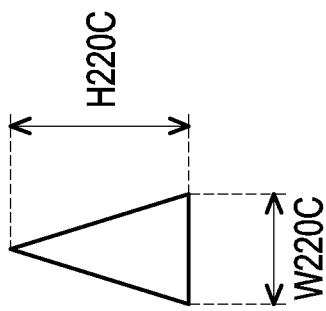
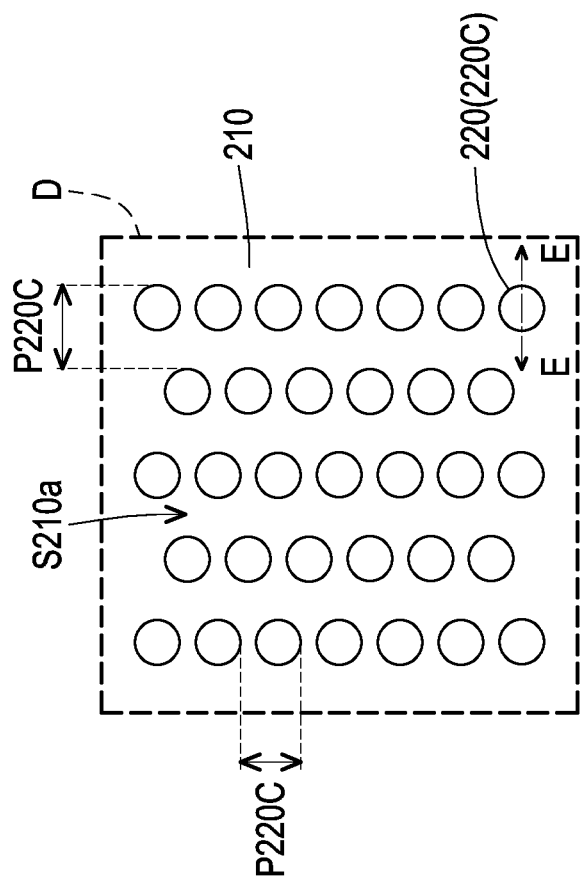
FIG. 13B
FIG. 13A

PICKUP APPARATUS AND METHOD OF USING THE SAME

BACKGROUND

The increasing operating speeds and computing power of semiconductor devices and electronic components have recently given rise to the need for an increase in the complexity and functionality of the semiconductor structures. The large scale integration (LSI) of more semiconductor devices and components has been developed to meet the demand.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a schematic plane view showing an alternative configuration of semiconductor packages to be picked-up in a pickup apparatus in accordance with some embodiments of the disclosure.

FIG. 13A and FIG. 13B are schematic side views of a protrusion of a roller included in a pickup apparatus in accordance with some alternative embodiments of the disclosure.

DETAILED DESCRIPTION

Figure 1A:
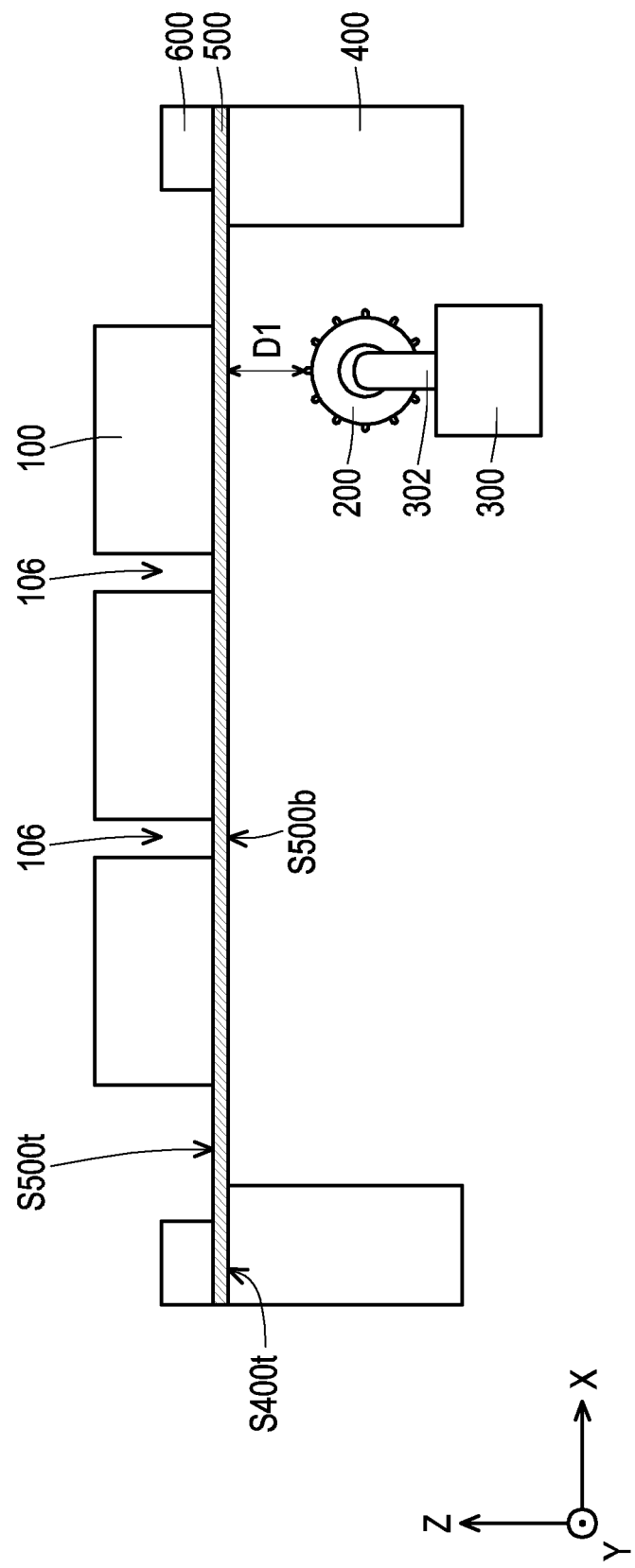
FIG. 1A, FIG. 2A, FIG. 3, FIG. 4A, FIG. 5, and FIG. 6 are schematic cross-sectional views showing a method of using a pickup apparatus during a pick-up process of a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

As used herein, "around," "about," "approximately," or "substantially" shall generally mean within 20 percent, or within 10 percent, or within 5 percent, or within 3 percent, or within 1 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

It should be appreciated that the following embodiment(s) of the disclosure provides applicable concepts that can be embodied in a wide variety of specific contexts. The specific embodiment(s) discussed herein is merely illustrative and is related to a pickup apparatus and its using method during a manufacture of a semiconductor package (such as a large-size semiconductor package having an area of about 40 mm² or more), and is not intended to limit the scope of the disclosure. The large-size semiconductor package may also be referred to as a large-size semiconductor device or component, and may be or include a wafer-level package (WLP), a package-on-package (PoP), a system-on-chip (SoC), a system-on-integrated-circuit (SoIC) device, an integrated fan-out (InFO) package, a chip-on wafer (CoW) package, or a chip-on wafer-on-substrate (CoWoS) package, or the like. In some embodiments, the large-size semiconductor package is further mounted to a substrate, such as a printed circuit board or the like. In accordance with some embodiments, a pickup apparatus includes a roller installed therein, where the roller includes a plurality of protrusions disposed on an outermost surface of the roller. Owing to the roller installed inside the pickup apparatus of the disclosure, a contact area between the large-size semiconductor package and a holding element (e.g., a non-UV dicing tape, a non-UV adhesive, or the like) thereof is greatly reduced because the large-size semiconductor package, at least a portion thereof, is effectively peeled off from the holding element through a deformation of the holding element caused by the protrusions of the roller. The roller having the protrusions is adopted in pickup apparatus to facilitate pick-up of the large-size semiconductor package from the dicing tape without an establishment of vacuum environment during the pick-up process, and thus the impacts caused by the warpage of the large-size semiconductor package during the pick-up process can be greatly suppressed or eliminate.

Figure 8B:
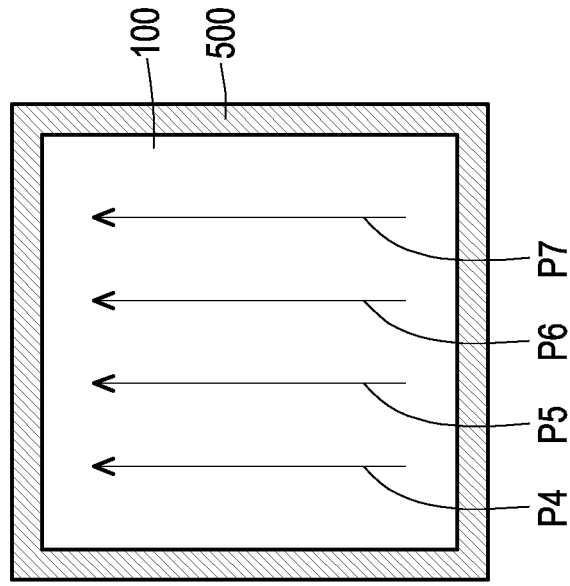
FIG. 8A through FIG. 8D are schematic plane views of various movement paths of a roller included in a pickup apparatus in accordance with some embodiments of the disclosure.
Figure 8A:
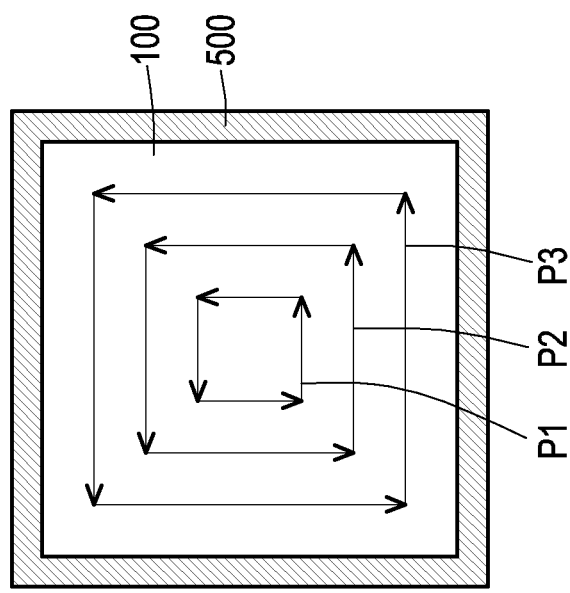
Figure 8D:
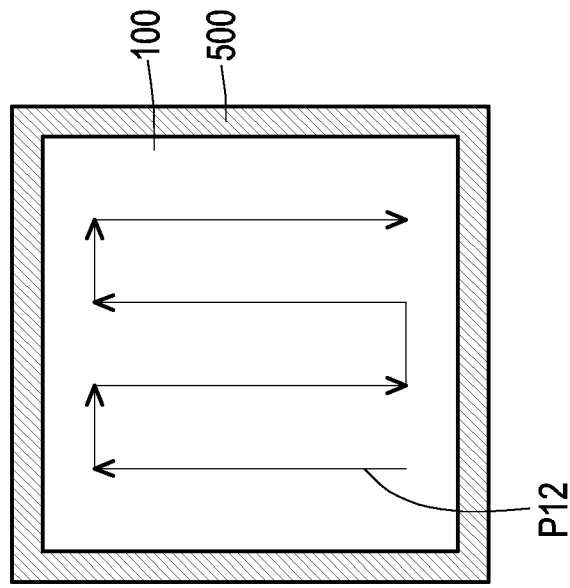
Figure 8C:
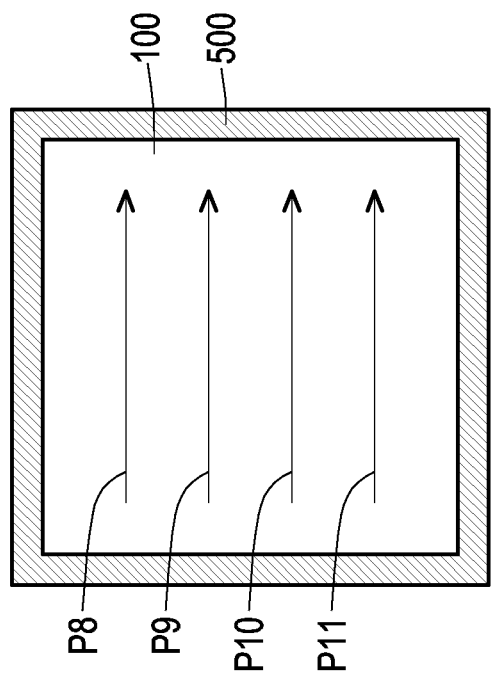
Figure 9B:
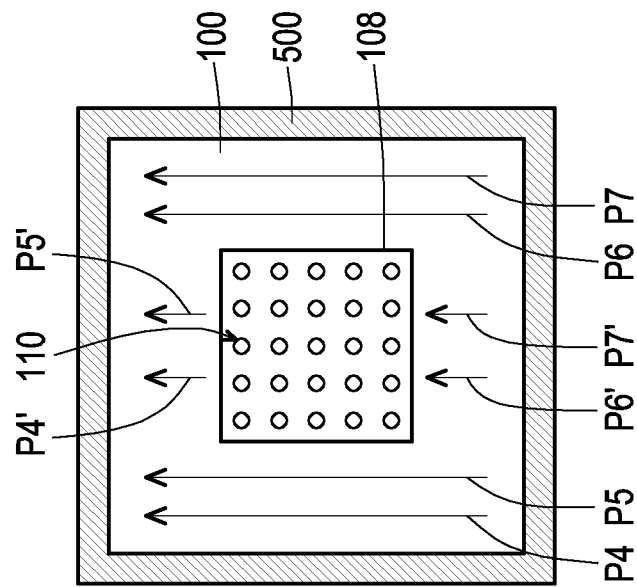
FIG. 9A through FIG. 9D are schematic plane views of various movement paths of a roller included in a pickup apparatus in accordance with some alternative embodiments of the disclosure.

FIG. 1A, FIG. 2A, FIG. 3, FIG. 4A, FIG. 5, and FIG. 6 are schematic cross-sectional views showing a method of using a pickup apparatus during a pick-up process of a semiconductor package in accordance with some embodiments of the disclosure. FIG. 1B and FIG. 2B are schematic plane views of the pickup apparatus and the semiconductor package respectively depicted in FIG. 1A and FIG. 2A, where the cross-sectional views of FIG. 1A, FIG. 2A, FIG. 3, FIG. 4A, FIG. 5, and FIG. 6 are taken along with a line A-A depicted in FIG. 1B and FIG. 2B. FIG. 4B is the schematic plane view of a portion of a holding element and the semiconductor package outlined in a box B depicted in FIG. 4A. FIG. 4C is the schematic, enlarged cross-sectional view of a portion of a holding element and the semiconductor package outlined in a box C depicted in FIG. 4A. FIG. 7 is a schematic plane view showing an alternative configuration of semiconductor packages to be picked-up in a pickup apparatus in accordance with some embodiments of the disclosure. FIG. 8A through FIG. 8D and FIG. 9A through FIG. 9D are schematic plane views of various movement paths of a roller included in a pickup apparatus in accordance with some embodiments of the disclosure. FIG. 10A and FIG. 10B are schematic side views of a roller included in a pickup apparatus in accordance with some embodiments of the disclosure, where the side views of FIG. 11A and FIG. 11B, FIG. 12A and FIG. 12B, FIG. 13A and FIG. 13B, and FIG. 14A and FIG. 14B show various embodiments of a configuration of protrusions of a portion of the roller outlined in a box D depicted in FIG. 10B. FIG. 15 illustrates a flowchart of a method of using a pickup apparatus during a pick-up process of a semiconductor package in accordance with some embodiments of the disclosure.

In embodiments, the manufacturing method is part of a wafer level packaging process. It is to be noted that the embodiments are intended to provide further explanations but are not used to limit the scope of the disclosure. Accordingly, it is understood that additional processes may be provided before, during, and after the illustrated method, and that some other processes may only be briefly described herein. In the disclosure, it should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto.

Figure 1B:
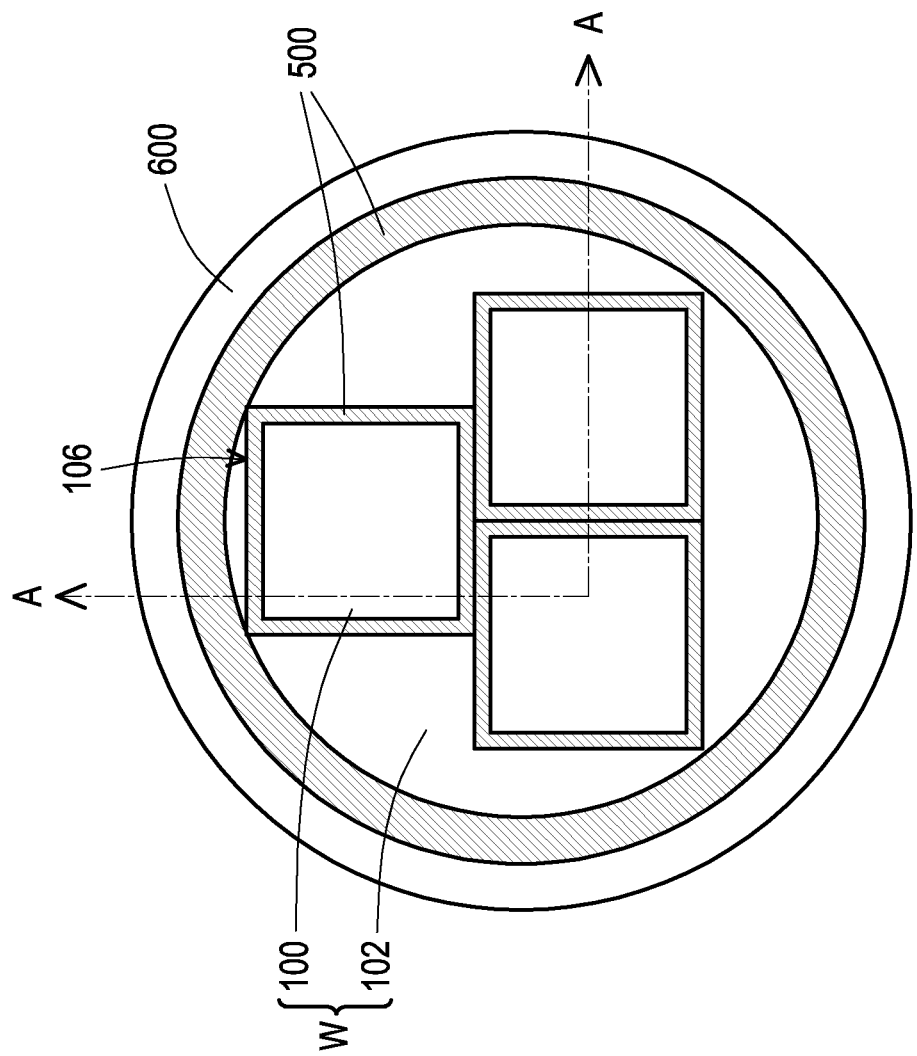
FIG. 1B is a schematic plane view of the pickup apparatus and the semiconductor package depicted in FIG. 1A.
Figure 1B:
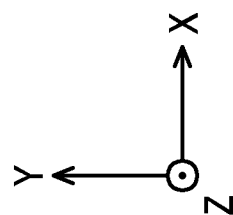

Referring to FIG. 1A and FIG. 1B, in some embodiments, a method of using a pickup apparatus 1000 (depicted in FIG. 6) during a pick-up process of a semiconductor package 100 includes following steps. First, a wafer W including a plurality of semiconductor packages 100 interconnected to one another is provided over a holding element 500, and a dicing process is then performed to cut through the wafer W along cutting lines and form a plurality of trenches 106 separating semiconductor packages 100 from each other. In some embodiments, the semiconductor packages 100 are separated from one or more than one dummy portion 102 of the wafer W through the trenches 106. For example, the trenches 106 accessibly reveal an illustrated top surface S500$t$ of the tape frame 500, as shown in FIG. 1A and FIG. 1B. In some embodiments, the holding element 500 is a continuous film. The holding element 500 may include a non-UV tape, a non-UV film/layer, or a non-UV adhesive film/layer. The holding element 500 may be referred to as an adhesion film, an adhesion layer, or an adhesive layer. For example, the holding element 500 may be referred to as a dicing tape. In one embodiment, the dicing process is a wafer dicing process including mechanical blade sawing or laser cutting.

Only three semiconductor packages 100 arranged in a form of T-shape and placed on the holding element 500 are shown in FIG. 1A and FIG. 1B for illustrative purposes and for simplicity; the disclosure is not limited thereto. The number of the semiconductor packages 100 may be one, two, three, or more than three, and may be in any arrangement. For example, there may be six semiconductor packages arranged in form of cross-shape, as shown in FIG. 7. Alternatively, the semiconductor packages 100 are arranged in the form of a matrix, such as a N×N array or a N×M array (N, M>0, N may or may not be equal to M) along a direction X and a direction Y. The direction X and the direction Y are not the same to each other and are perpendicular to each other, for example.

In one embodiment, the semiconductor packages 100 each include a plurality of semiconductor dies/chips, one or more encapsulants encapsulating the plurality of semiconductor dies/chips, one or more redistribution circuit structures (each having one or more than one redistribution layer) electrically coupled to the plurality of semiconductor dies/chips for providing horizontal and vertical electrical connections to the plurality of semiconductor dies/chips, and a plurality of conductive terminals electrically coupled to the plurality of semiconductor dies/chips and the one or more redistribution circuit structures. For a non-limiting example, the conductive terminals are arranged at an outermost side of each of the semiconductor packages 100 for providing electrical connections to external devices or components. The plurality of semiconductor dies/chips may be arranged into one-tier structure or multi-tier structure (e.g., stacking along a direction Z). The stacking direction Z is different from and substantially perpendicular to the direction X and the direction Y, for example. In the embodiments of which the plurality of semiconductor dies/chips are arranged into the multi-tier structure, the tiers are separated from each other by a respective one redistribution circuit structure, and the semiconductor dies/chips of each tiers are electrically coupled and electrically communicated by the redistribution circuit structure(s) sandwiched thereon and the semiconductor dies/chips of adjacent tiers are electrically coupled and electrically communicated by the redistribution circuit structure(s) sandwiched therebetween. Alternatively, the semiconductor packages 100 each may further include a plurality of conductive pillars penetrating the one or more encapsulants for providing vertical electrical connections to the plurality of semiconductor dies/chips and the one or more redistribution circuit structures. The conductive pillars may be referred to as through-insulator-vias (TIVs), sometimes.

In some embodiments, the semiconductor dies/chips independently include a digital chip, an analog chip or a mixed signal chip. For a non-limiting example, the semiconductor dies/chips independently are a logic die (e.g., a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller); a power management die (e.g., a power management integrated circuit (PMIC) die); a wireless and radio frequency (RF) die; a baseband (BB) die; a sensor die (e.g., a photo/image sensor chip); a micro-electro-mechanical-system (MEMS) die; a signal processing die (e.g., a digital signal processing (DSP) die); a front-end die (e.g., an analog front-end (AFE) die); an application-specific die (e.g., an application-specific integrated circuit (ASIC)); a field-programmable gate array (FPGA); a combination thereof; or the like. For an alternative non-limiting example, the semiconductor dies/chips independently are a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO), a pre-stacked memory cube such as a hybrid memory cube (HMC) module, a high bandwidth memory (HBM) module; a combination thereof; or the like. For a further alternative non-limiting example, the semiconductor dies/chips independently are an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. For a yet alternative non-limiting example, the semiconductor dies/chips independently are an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The type of the semiconductor dies/chips may be selected and designated based on the demand and design requirement, and thus is not specifically limited in the disclosure.

In some embodiments, the one or more encapsulants independently include a molding compound, a molding underfill, a resin (such as epoxy), or the like. The one or more encapsulants may be formed by a molding process, such as a compression molding process or a transfer molding process. In some embodiments, the one or more encapsulants may further include inorganic filler or inorganic compound (e.g. silica, clay, and so on) which can be added therein to optimize coefficient of thermal expansion (CTE) of the one or more encapsulants. The disclosure is not limited thereto.

In some embodiments, the one or more redistribution circuit structures include at least one dielectric layer and at least one patterned conductive layer alternately arranged. The dielectric layer(s) may be polyimide (PI), polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. The etching process may include a dry etching, a wet etching, or a combination thereof. The dielectric layer(s) may be formed by suitable fabrication techniques such as spin-on coating, chemical vapor deposition (CVD) such as plasma-enhanced chemical vapor deposition (PECVD), or the like. The patterned conductive layer(s) may be made of conductive materials formed by electroplating or deposition, such as copper, copper alloy, aluminum, aluminum alloy, or combinations thereof, which may be patterned using a photolithography and etching process. The etching process may include a dry etching, a wet etching, or a combination thereof. In some embodiments, the patterned conductive layer(s) are patterned copper layers or other suitable patterned metal layers. The patterned conductive layer(s) may include a line portion extending along a horizontal direction (e.g., the direction X or the direction Y), a via portion extending along a vertical direction (e.g., the direction Z), or a combination thereof. For a non-limiting example, the patterned conductive layer (s) may be metal lines, metal vias, metal pads, metal traces, etc. The numbers of the dielectric layer(s) and the number of the patterned conductive layer(s) are not limited in the disclosure, and may be selected and designated based on demand and design layout. In addition, a plurality of seed layers may be further included in the one or more redistribution circuits structure to facilitate the formation of the patterned conductive layer(s).

In some embodiments, the conductive terminals include micro-bumps, metal pillars, controlled collapse chip connection (C4) bumps (for example, which may have, but not limited to, a size of about 80 μm), a ball grid array (BGA) bumps (for example, which may have, but not limited to, a size of about 400 μm), electroless nickel-immersion gold technique (ENIG) formed bumps, electroless nickel-electroless palladium-immersion gold technique (ENEPIG) formed bumps, or the like. The disclosure is not limited thereto. The conductive terminals may include solder balls. The material of the conductive terminals may include either eutectic solder or non-eutectic solder. The solder may include lead or be lead-free, and may include Sn—Ag, Sn—Cu, Sn—Ag—Cu, or the like. For example, the material of the conductive terminals may include a lead-free (LF) solder material (such as Sn-base materials) with or without additional impurity (such as Ni, Bi, Sb, Ag, Cu, Au, or the like). The numbers of the conductive terminals is not limited in the disclosure, and may be selected and designated based on the demand and design requirements. In addition, an under-ball metallurgy (UBM) may be further formed prior to the formation of the conductive terminals to facilitate the formation of the conductive terminals.

In some embodiments, the conductive pillars are arranged next to the semiconductor dies/chips but not on the cutting lines between two semiconductor packages 100. The material of the conductive pillars may include a metal material such as copper or copper alloys, or the like. The conductive pillars may also be referred to as through integrated fan-out (InFO) vias, vertical connectors, or vertical connections.

In the plane view of FIG. 1B, the shape of the semiconductor packages 100 may depend on the design requirements, and is not intended to be limiting in the disclosure. For example, in a top (plane) view on a X-Y plane perpendicular to the direction Z, the shape of the semiconductor packages 100 is rectangular shape. However, depending on the design requirements, and the shape of the semiconductor packages 100 may be an oval shape, a polygonal shape, or combinations thereof; the disclosure is not limited thereto.

Continued to FIG. 1A and FIG. 1B, in some embodiment, the wafer W including the semiconductor packages 100 and the dummy portion 102 adhered to the holding element 500 is placed onto a platform 400 of the pickup apparatus 1000, in accordance with step S2010 of a method 2000 in FIG. 15. In some embodiments, the pickup apparatus 1000 includes a roller 200, a moving mechanism 300, the platform 400, a covering lid 700, and a collector element 800 (depicted in FIG. 6). For example, the holding element 500 is fixed onto the platform 400 of the pickup apparatus 1000 through a loading element 600, where the holding element 500 is sandwiched between the loading element 600 and the platform 400. In the case, the loading element 600 is disposed on (e.g., overlapped with) the platform 400. As shown in FIG. 1A, the semiconductor packages 100 and the loading element 600 may be in physical contact with the illustrated top surface S500t of the holding element 500, and the platform 500 (e.g., an illustrated top surface S500t thereof) may be in physical contact with an illustrated bottom surface S500b of the holding element, where the illustrated bottom surface S500b and the illustrated top surface S500t may be opposite to each other in the direction Z and may both be considered as planar surfaces extending along the X-Y plane. The wafer W including the semiconductor packages 100 and the dummy portion 102 is disposed inside (e.g., completely surrounded by) the loading element 600, as shown in FIG. 1B, for example.

As shown in FIG. 1A and FIG. 1B, for example, an edge of the holding element 500 is clamped by the loading element 600. The loading element 600 may include a fastener such as a flange ring, a bolt, or the like. For a non-limiting example, the loading element 600 is a flange ring made of a conductive material (e.g., metal or metallic materials). For another non-limiting example, the loading element 600 is a flange ring made of a dielectric material having sufficient stiffness (which may be quantified by its Yong's modulus) to hold/maintain the holding element 500 in a proper position to the platform 400, e.g., at the illustrated top surface S400t of the platform 400. In some embodiments, the platform 400 is made of a material with a sufficient stiffness (which may be quantified by its Yong's modulus) for protecting elements disposed therein and for supporting elements disposed thereon. The material of the platform 400 may include a conductive material, a dielectric material, or a combination of dielectric material and conductive material. For example, the platform 400 is a frame stage made of a metal or a metal alloy.

In some embodiments, the roller 200 and the moving mechanism 300 are disposed inside the platform 400 underneath the holding element 500. In the case, the roller 200 and the moving mechanism 300 are surrounded by and distant from an inner sidewall of the platform 400. The roller 200 and the moving mechanism 300 may be laterally spaced away from the platform 400. The roller 200 and the moving mechanism 300 are under the holding element 500 placed on the illustrated top surface S400t of the platform 400, as shown in FIG. 1A, for example. In some embodiments, the roller 200 is disposed at a position vertically distant from (e.g., under) the illustrated top surface S400t of the platform 400 (where the illustrated bottom surface S500B of the holding element 500 located at) by a distance D1. For example, the distance D1 is approximately ranging from 0.5 mm to 5 mm, although other suitable distance may alternatively be utilized. In the disclosure, during the pick-up process of using the pickup apparatus 1000, the roller 200 is set at an initial position (referred to as a first configuration) of being vertically distant from the illustrated bottom surface S500B of the holding element 500 located at) by the distance D1.

As shown in FIG. 1A in conjunction with FIG. 10A and FIG. 10B, in some embodiments, the roller 200 includes a body 210 and a plurality of protrusions 220 distributed over an outermost surface of the body 210. The body 210 may include a cylindrical column having two end surfaces (not labeled) each having a diameter D200 and a sidewall S210a connecting the end surfaces and having a height H200. For example, the diameter D200 is approximately ranging from 5.0 mm to 30.0 mm, although other suitable diameter may alternatively be utilized. For example, and the height H200 is approximately ranging from 5.0 mm to 30.0 mm, although other suitable height may alternatively be utilized. For example, the protrusions 220 are disposed on the sidewall S210a of the body 210, as shown in FIG. 10A and FIG. 10B.

The protrusions 220 may be arranged in an array. In some embodiments, the protrusions 220 are arranged in the form of a matrix, such as a N'×N' array or a N'×M' array (N', M'>0, N' may or may not be equal to M') along the direction X and the direction Y. In some embodiments, the protrusions 220 arranged in immediately adjacent rows and/or columns are positioned in an alignment manner (e.g., an array form) on the X-Y plane, see a protrusion 220 (also denoted as 220A) depicted in FIG. 11A and FIG. 11B. In alternative embodiments, the protrusions 220 arranged in immediately adjacent rows and/or columns are positioned in a staggered manner (e.g., a staggered form) on the X-Y plane, see a protrusion 220 (also denoted as 220B) depicted in FIG. 12A and FIG. 12B and/or a protrusion 220 (also denoted as 220C) depicted in FIG. 13A and FIG. 13B. In other alternative embodiments, the protrusions 220 are arranged to each other immediately in a parallel manner (along a single direction on the X-Y plane), see a protrusion 220 (also denoted as 220D) depicted in FIG. 14A and FIG. 14B. In further alternative embodiments, the protrusions 220 are arranged into a predetermined pattern in a concentric manner (e.g., in a radial arrangement), not shown. The disclosure is not limited thereto; alternatively, the protrusions 220 may be randomly arranged on the sidewall S210a of the body 210 by a distance between two adjacent protrusions 220, the distance may be approximately ranging from 1.0 mm to 6.0 mm (for example, from 1.0 mm to 3.0 mm), although other suitable distance may alternatively be utilized.

Figure 10B:
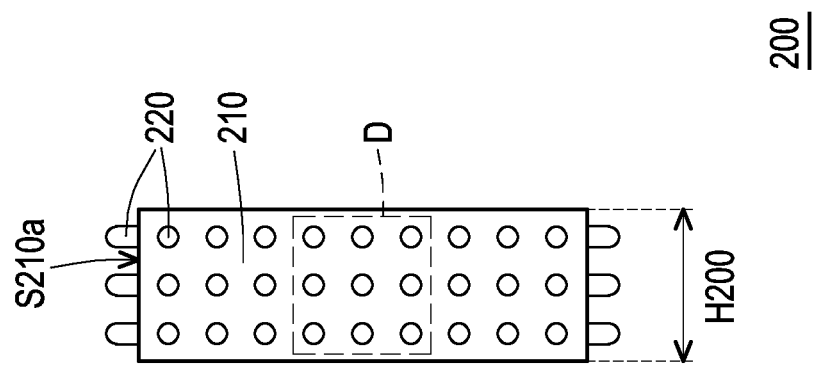
FIG. 10A and FIG. 10B are schematic side views of a roller included in a pickup apparatus in accordance with some embodiments of the disclosure.
Figure 10A:
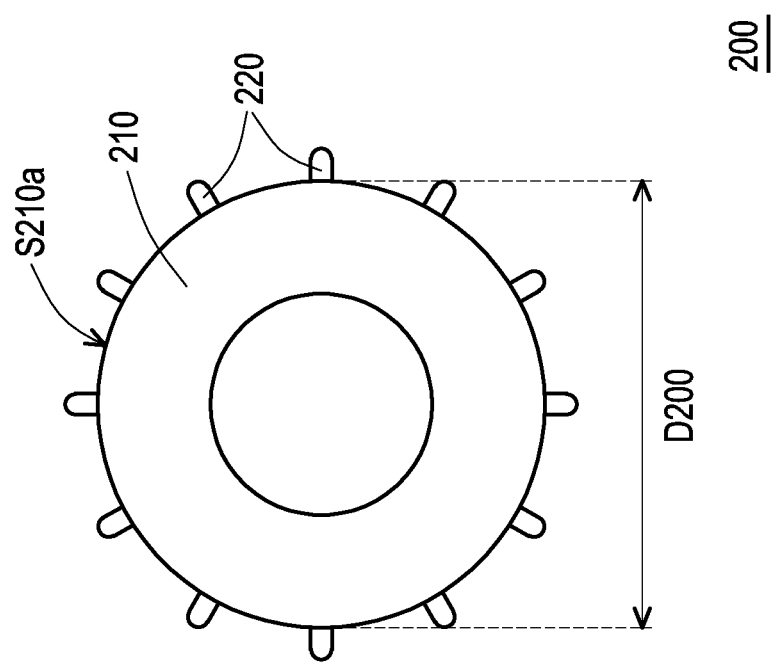
Figure 11B:
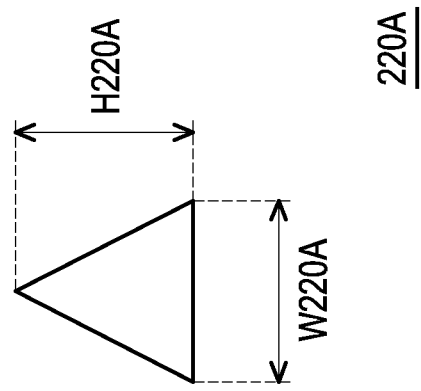
FIG. 11A and FIG. 11B are schematic side views of a protrusion of a roller included in a pickup apparatus in accordance with some embodiments of the disclosure.
Figure 11A:
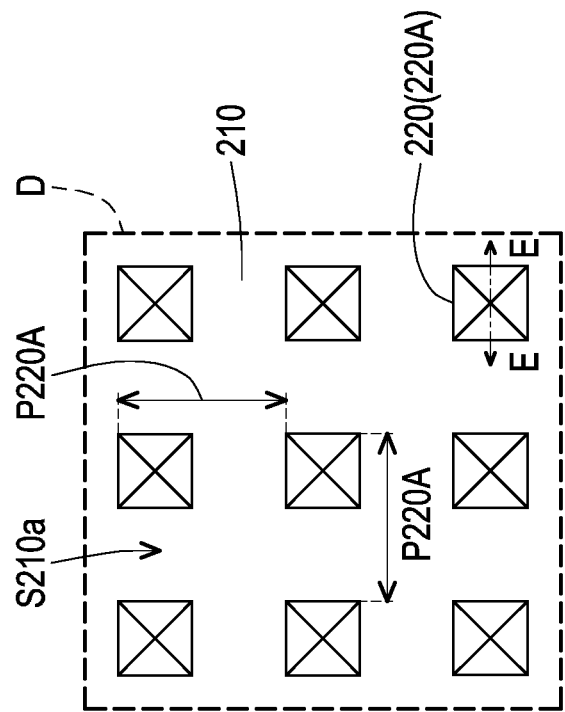

As shown in FIG. 10A and FIG. 10B in conjunction with FIG. 11A and FIG. 11B, for example, the protrusions 220 include a plurality of protrusions 220A, where the geometry of the protrusions 220A each include a pyramid having a base of rectangular-shape, and the base of the protrusions 220A are in contact with the sidewall S210a of the body 210. As shown in a plane view of FIG. 11A, a pitch P220A of the protrusions 220A may be ranging approximately from 1.0 mm to 6.0 mm, although other suitable pitch may alternatively be utilized. In a cross-sectional view of FIG. 11B taken along a line E-E depicted in the plane view of FIG. 11A, a shape of the protrusions 220A includes a triangle having a height H220A with a base thereof having a width W220A, for example. The height H220A of the protrusions 220A may be ranging approximately from 0.5 mm to 3.0 mm, although other suitable height may alternatively be utilized. The width W220A of the protrusions 220A may be ranging approximately from 0.5 mm to 3.0 mm, although other suitable width may alternatively be utilized.

Figure 12B:
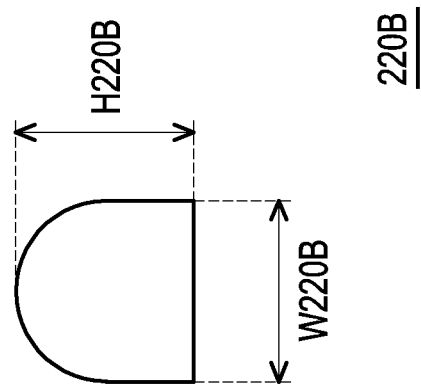
FIG. 12A and FIG. 12B are schematic side views of a protrusion of a roller included in a pickup apparatus in accordance with some alternative embodiments of the disclosure.
Figure 12A:
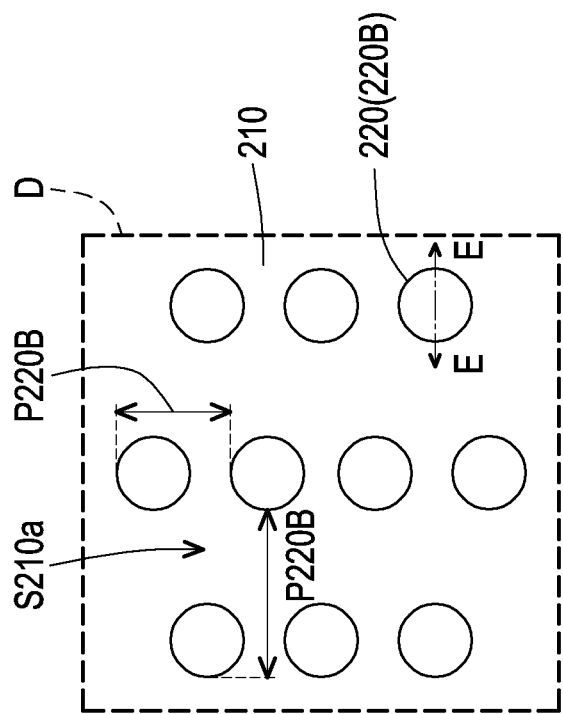

As shown in FIG. 10A and FIG. 10B in conjunction with FIG. 12A and FIG. 12B, for example, the protrusions 220 include a plurality of protrusions 220B, where the geometry of the protrusions 220B each include a truncated capsule (or saying, a "truncated spherocylinder" having a structure of a cylinder and a hemisphere connecting thereon, where the hemisphere is connected to only one of two opposite planar ends of the cylinder so to render a column structure having a planar end (having a substantially planar surface) and a curved end (having a convex surface in respect to the substantially planar surface) opposing to the planar end in a cross-section thereof) having a (planar) base of circular-shape, and the (planar) base of the protrusions 220B are in contact with the sidewall S210a of the body 210. As shown in a plane view of FIG. 12A, a pitch P220B of the protrusions 220B may be ranging approximately from 1.0 mm to 6.0 mm, although other suitable pitch may alternatively be utilized. In a cross-sectional view of FIG. 12B taken along a line E-E depicted in the plane view of FIG. 12A, a shape of the protrusions 220B includes a shape of a rectangular connected with a dome at one end thereof, where such shape has a height H220A with a base thereof having a width W220B, for example. The height H220B of the protrusions 220B may be ranging approximately from 0.5 mm to 3.0 mm, although other suitable height may alternatively be utilized. The width W220B of the protrusions 220B may be ranging approximately from 0.5 mm to 3.0 mm, although other suitable width may alternatively be utilized.

As shown in FIG. 10A and FIG. 10B in conjunction with FIG. 13A and FIG. 13B, for example, the protrusions 220 include a plurality of protrusions 220C, where the geometry of the protrusions 220C each include a rounded needle (e.g., having a needle-shaped cross section with a rounded tip, and a (planar) base of circular-shape as viewed in a planar view, where the (planar) base of the protrusions 220C are in contact with the sidewall S210a of the body 210). As shown in a plane view of FIG. 13A, a pitch P220C of the protrusions 220C may be ranging approximately from 1.0 mm to 6.0 mm, although other suitable pitch may alternatively be utilized. In a cross-sectional view of FIG. 13B taken along a line E-E depicted in the plane view of FIG. 13A, a shape of the protrusions 220C includes a shape of a rounded triangle (e.g., a tip of the needle-shape is rounded), where such shape has a height H220C with a base thereof having a width W220C, for example. The height H220C of the protrusions 220C may be ranging approximately from 0.5 mm to 3.0 mm, although other suitable height may alternatively be utilized. The width W220C of the protrusions 220C may be ranging approximately from 0.05 mm to 1.0 mm, although other suitable width may alternatively be utilized.

Figure 14B:
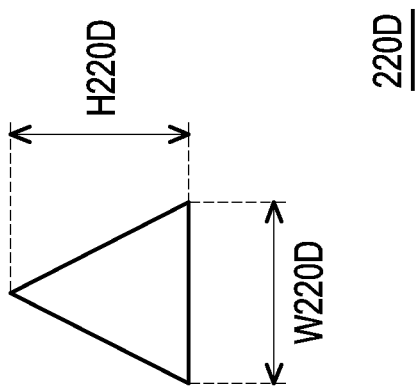
FIG. 14A and FIG. 14B are schematic side views of a protrusion of a roller included in a pickup apparatus in accordance with some alternative embodiments of the disclosure.
Figure 14A:
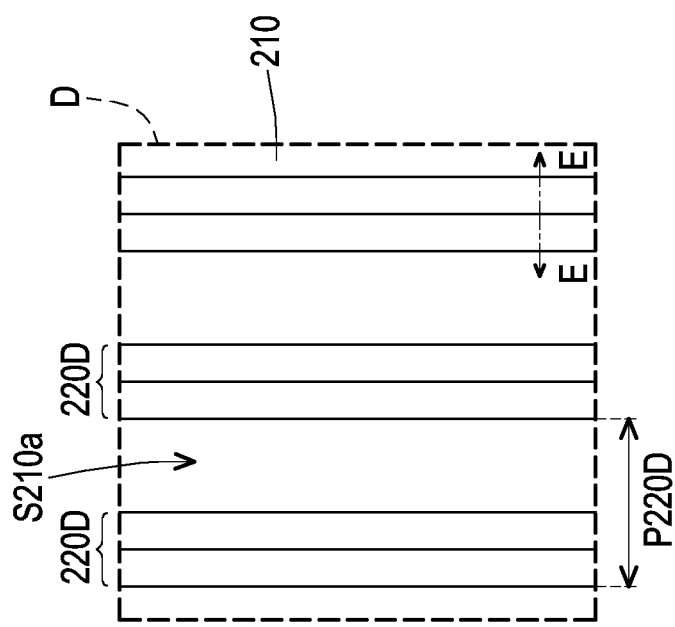
Figure 15:
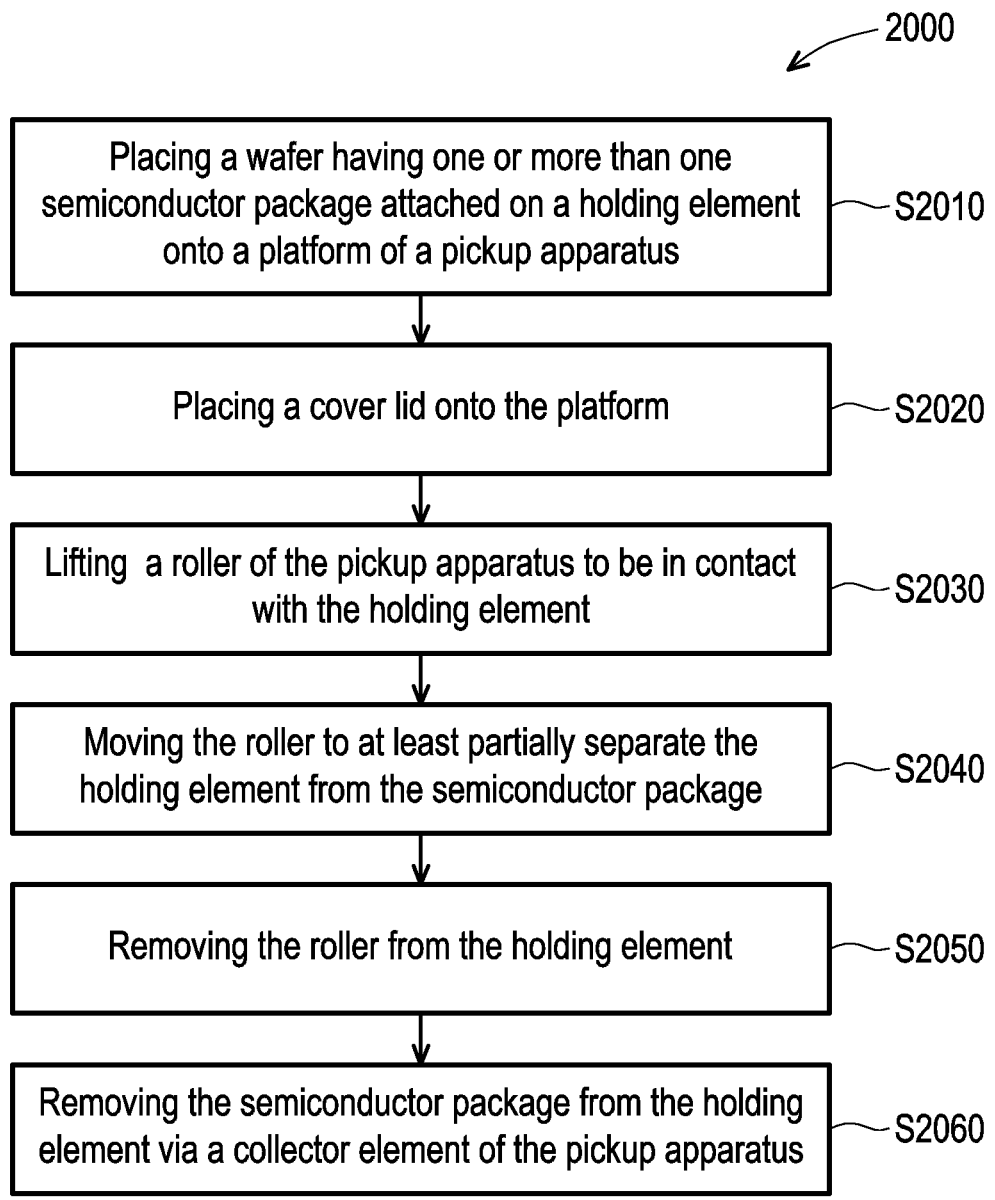
FIG. 15 illustrates a flowchart of a method of using a pickup apparatus during a pick-up process of a semiconductor package in accordance with some embodiments of the disclosure.

As shown in FIG. 10A and FIG. 10B in conjunction with FIG. 14A and FIG. 14B, for example, the protrusions 220 include a plurality of protrusions 220D, where the geometry of the protrusions 220C each include a triangle strip (e.g., having a triangular-shaped cross section, and a (planar) base of rectangular-shape as viewed in a planar view, and the (planar) base of the protrusions 220D are in contact with the sidewall S210a of the body 210). As shown in a plane view of FIG. 14A, a pitch P220D of the protrusions 220D may be ranging approximately from 1.0 mm to 3.0 mm, although other suitable pitch may alternatively be utilized. In a cross-sectional view of FIG. 14B taken along a line E-E depicted in the plane view of FIG. 14A, a shape of the protrusions 220D includes a triangle having a height H220D with a base thereof having a width W220D, for example. The height H220D of the protrusions 220D may be ranging approximately from 0.5 mm to 3.0 mm, although other suitable height may alternatively be utilized. The width W220D of the protrusions 220D may be ranging approximately from 0.5 mm to 5.0 mm, although other suitable width may alternatively be utilized.

In further alternative embodiments, the protrusions 220 may be in contact with one another at the bases thereof. In such case, a spacing distance of the protrusions 220 is zero.

The disclosure is not limited thereto; alternatively, the protrusions 220 may include at least two of the protrusions 220A, 220B, 220C, and 220D, such as a group of the protrusions 220A and 220B, a group of the protrusions 220A and 220C, a group of the protrusions 220A and 220D, a group of the protrusions 220A, 220B and 220C, a group of the protrusions 220A, 220B and 220D, a group of the protrusions 220A, 220C and 220D, a group of the protrusions 220B, 220C and 220D, or a group of the protrusions 220A, 220B, 220C, and 220D.

Back to FIG. 1A and FIG. 1B, in some embodiments, the roller 200 is connected to the moving mechanism 300 through mechanical arms 302, where the mechanical arms 302 are mechanically connected to the end surfaces of the body 210, respectively. Owing to the moving mechanism 300, the roller 200 is capable of moving vertically along the direction Z and/or horizontally along the direction X and/or Y by the moving mechanism 300. The moving mechanism 300 may include at least one motor configured to move the roller 200 vertically along the direction Z and/or horizontally along the direction X and/or Y.

Figure 2A:
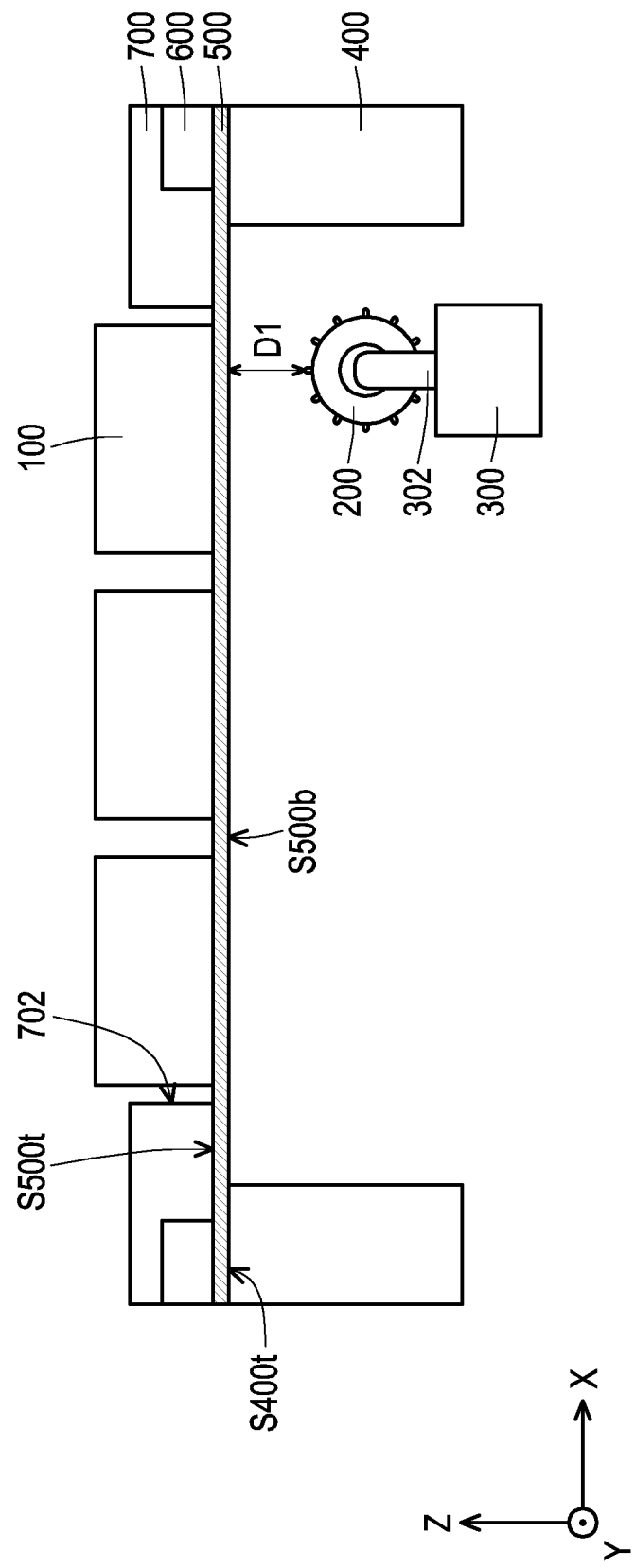
Figure 2B:
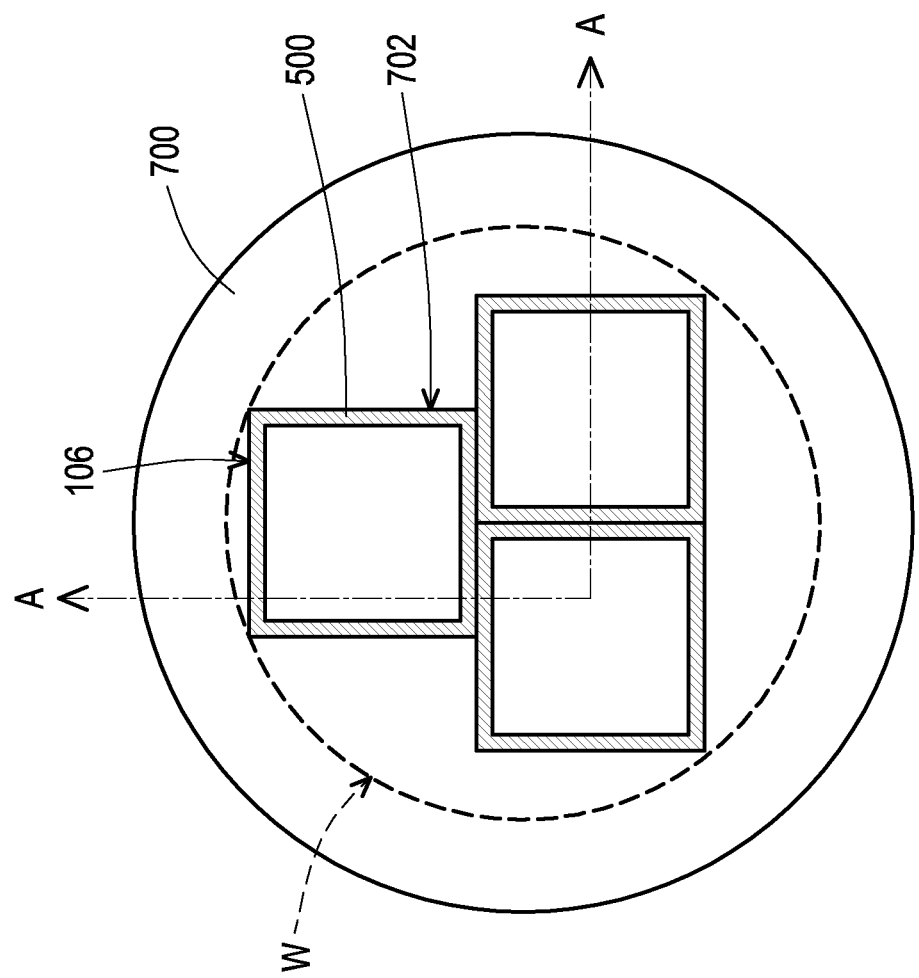
FIG. 2B is a schematic plane view of the pickup apparatus and the semiconductor package depicted in FIG. 2A.

Referring to FIG. 2A and FIG. 2B, in some embodiments, the covering lid 700 is placed onto the platform 400, in accordance with step S2020 of the method 2000 in FIG. 15. For example, the covering lid 700 is engaged with the loading element 600 for securing the holding element 500 fixed to the loading element 600 onto the platform 400 of the pickup apparatus 1000. As shown in FIG. 2A and FIG. 2B, the covering lid 700 may include a through opening 702 accessibly revealing the semiconductor packages 100 and cover the dummy portion 102 and the loading element 600. In such case, the covering lid 700 may further extend onto a portion of the holding element 500 exposed by the semiconductor packages 100, the dummy portion 102 and the loading element 600. For example, a sidewall of the through opening 702 is spaced apart from the semiconductor packages 100. For a non-limiting example, the covering lid 700 is a cover made of a conductive material (e.g., metal or metallic materials). For another non-limiting example, the covering lid 700 is a cover made of a dielectric material having sufficient stiffness (which may be quantified by its Yong's modulus) to hold/maintain the loading element 600 in a proper position to the platform 400. In some embodiments, a material of the covering lid 700 is the same as a material of the loading element 600. In alternative embodiments, the material of the covering lid 700 is different from the material of the loading element 600. The disclosure is not limited thereto.

Figure 3:
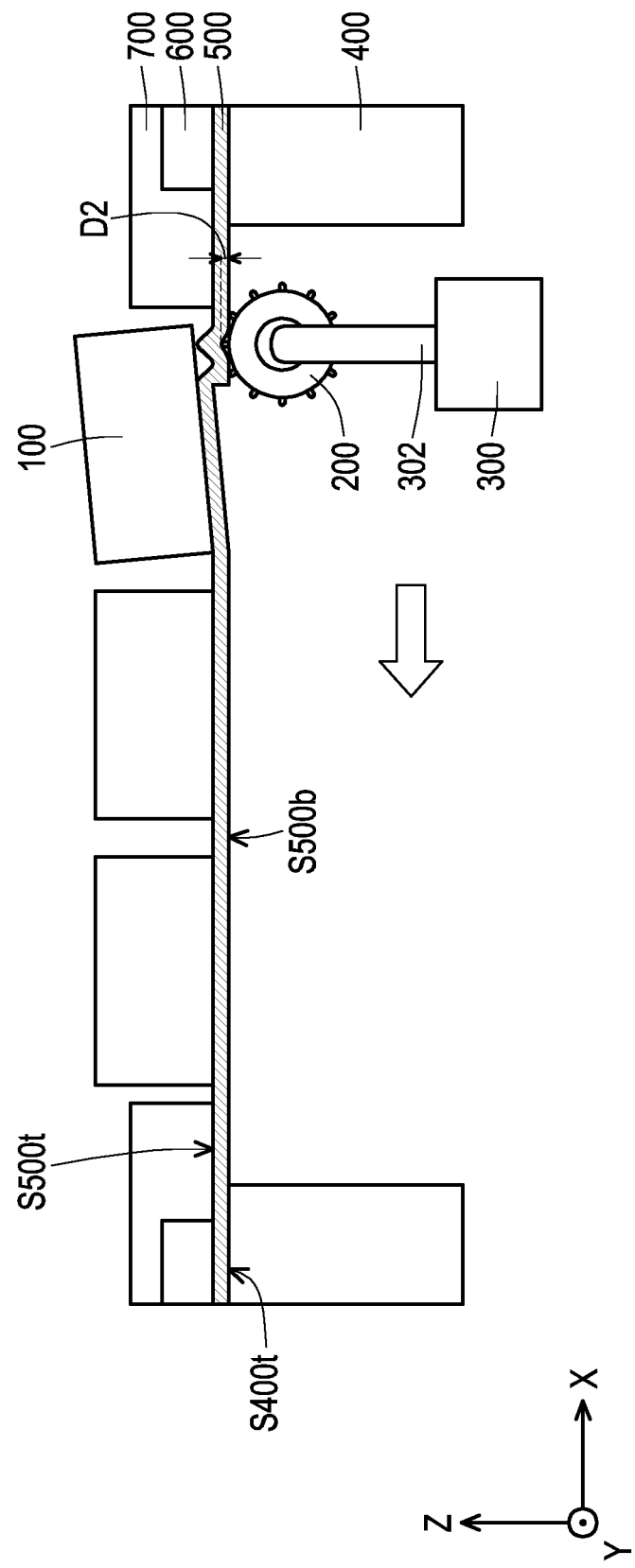
Figure 4A:
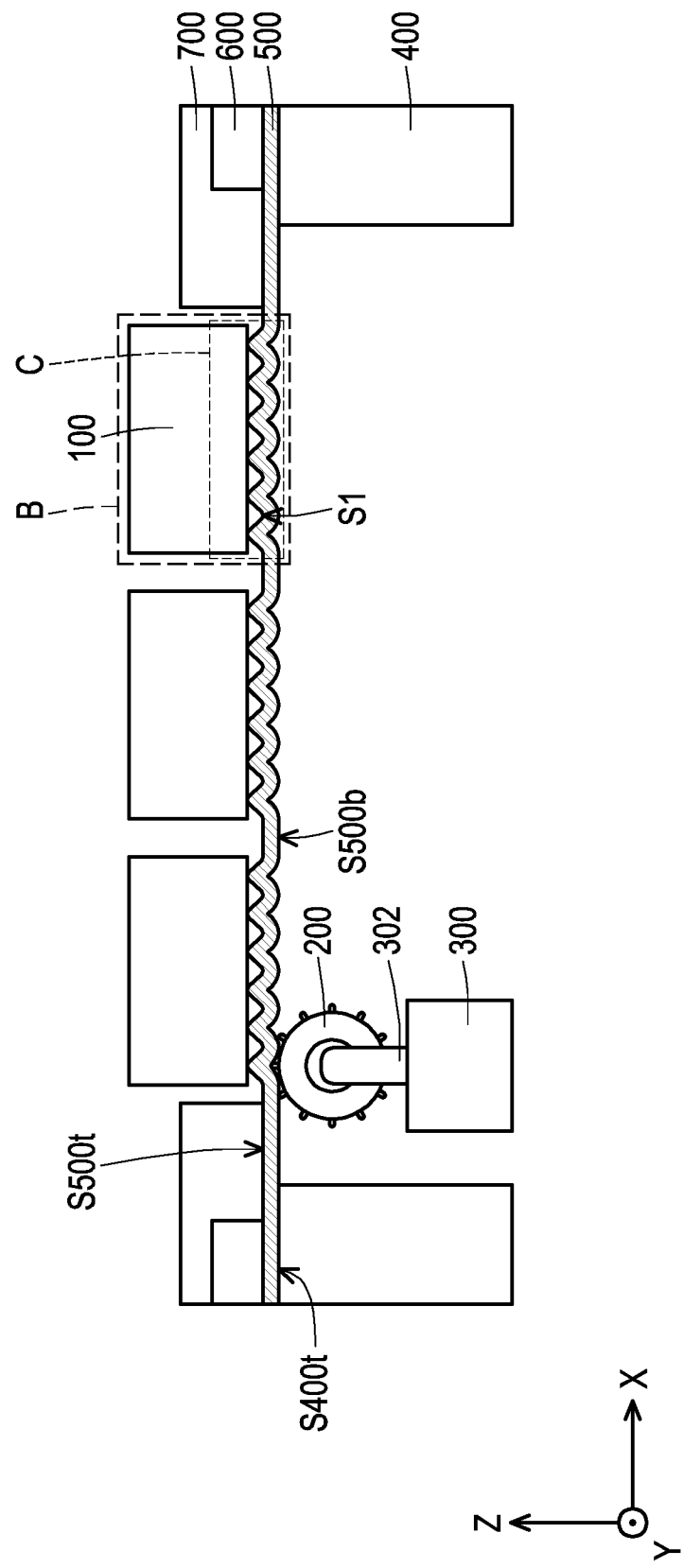
Figure 4C:
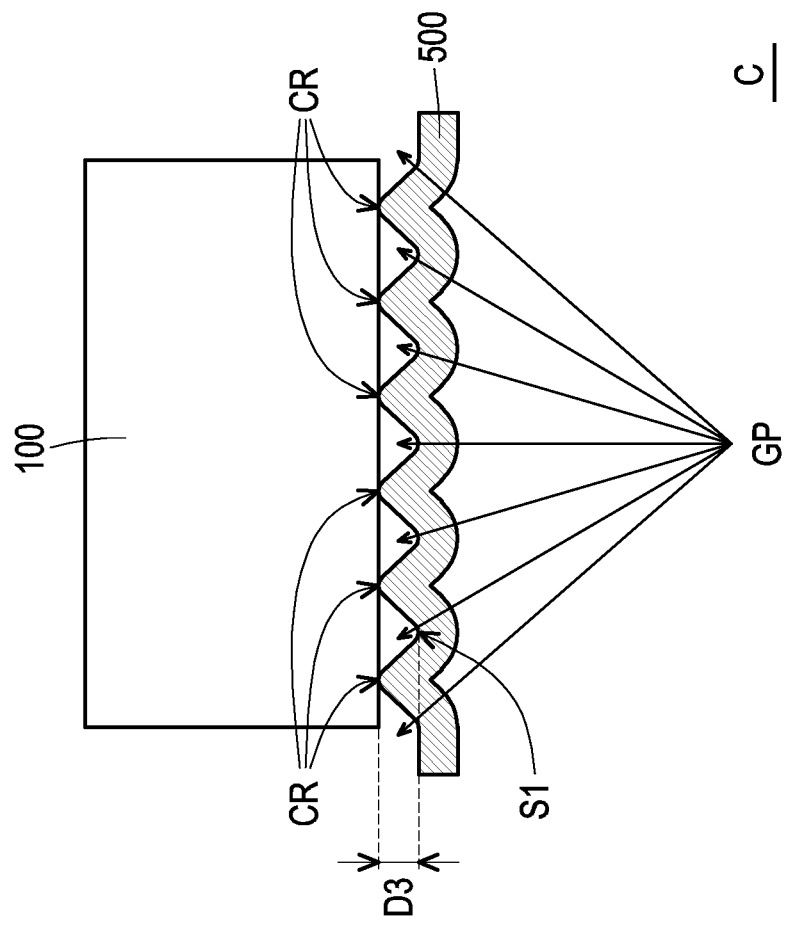
FIG. 4C is a schematic, enlarged cross-sectional view of a portion of a holding element and the semiconductor package depicted in FIG. 4A.
Figure 4B:
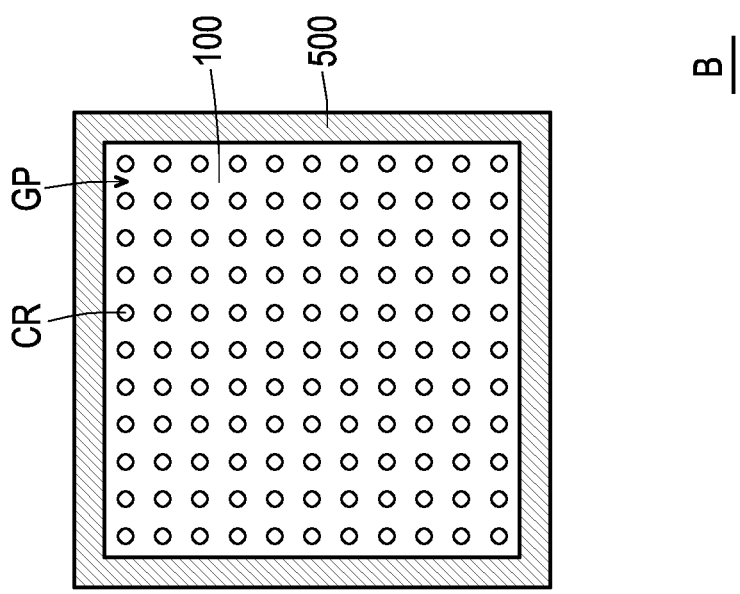
FIG. 4B is a schematic plane view of a portion of a holding element and the semiconductor package depicted in FIG. 4A.

Referring to FIG. 3 and FIG. 4A, in some embodiments, the roller 200 is lifted upwards to be in contact with the holding element 500, and the roller 200 is moved along a pre-determined path to at least partially separate the holding element 500 from the semiconductor packages 100, in accordance with step S2030 and step S2040 of the method 2000 in FIG. 15. For example, the roller 200 is disposed at a position vertically distant from (e.g., over) the illustrated top surface S400t of the platform 400 (where the illustrated bottom surface S500B of the holding element 500 located at) by a distance D2, as shown in FIG. 3. The distance D2 may be approximately ranging from 0.5 mm to 5.0 mm, although other suitable distance may alternatively be utilized. In the disclosure, during the pick-up process of using the pickup apparatus 1000, the roller 200 is set at a lifting position (referred to as a second configuration) of being vertically inserted into the holding element 500 from the illustrated bottom surface S500B by the distance D2. Owing to the insertion of the protrusions 210 included in the roller 200, a portion of the holding element 500 being contacted with the protrusions 210 undergoes a deformation in its' appearance shape, thereby releasing illustrated bottom surfaces (not labeled) of the semiconductor packages 100 from the holding element 500. For example, with the second configuration, the roller 200 is moved along the pre-determined path on the X-Y plane (e.g., in the direction X and/or the direction Y), as shown in FIG. 4A. In the case, a great part of the illustrated bottom surfaces of the semiconductor packages 100 are peeled off from the holding element 500 due to the deformation in the holding element 500. It is appreciated that such deformation to the holding element 500 is permanent, and thus a re-stick issue between the semiconductor packages 100 and the holding element 500 can be greatly suppressed. With using the roller 200 having the protrusions 210, the efficiency of a pick-up process of the large size semiconductor package (e.g., the semiconductor packages 100) may be greatly improved.

Referring to FIG. 4A in conjunction with FIG. 4B and FIG. 4C, after moving the roller 200 along the X-Y plane with the second configuration, the holding element 500 is partially peeled off from the illustrated bottom surfaces of the semiconductor packages 100, in some embodiments. In FIG. 4B and FIG. 4C, only one semiconductor package 100 and a respective portion of the holding element 500 are emphasized for illustrated purposes and simplicity. For example, after moving the roller 200 along the X-Y plane with the second configuration, portions of the holding elements 500 prop against the protrusions 210 of the roller 200 are still in contact with the illustrated bottom surface of the semiconductor package 100 at a plurality of contact regions CR, while rest of portions of the holding elements 500 free from the protrusions 210 of the roller 200 are separated from the illustrated bottom surface of the semiconductor package 100 by a gap GP, as shown in FIG. 4B and FIG. 4C. In some embodiments, an illustrated top surface S1 of the deformed portion of the holding element 500 and the illustrated bottom surface of the semiconductor package 100 are distant to each other through the gap GP. For example, the gap GP includes a maximum distance D3 between the illustrated top surface S1 of the deformed portion of the holding element 500 and the illustrated bottom surface of the semiconductor package 100. The distance D3 may be approximately ranging from 0.05 mm to 3.0 mm, although other suitable distance may alternatively be utilized. Due to the gap GP, the adhesion strength between the semiconductor packages 100 and the holding element 500 is greatly reduced, thereby facilitating the pick-up process of the semiconductor packages from the holding element 500.

In some embodiments, the roller 200 is moved along the X-Y plane with the second configuration under the semiconductor packages 100 with the predetermined path, where the predetermined path is programmable based on the demand and design requirement, and thus is not specifically limited in the disclosure; the disclosure is not specifically limited thereto. For a non-limiting example, as shown in FIG. 8A, the roller 200 is moved in a predetermined path including paths P1, P2 and P3, where the paths P1, P2 and P3 independently extend along the periphery of each semiconductor package 100 and separated from each other by a suitable distance. In some embodiment the paths P1, P2 and P3 are in form of a closed frame as view in the plane view of FIG. 8A. The paths P1, P2 and P3 may be arranged in a concentric manner and parallel to each other. For another non-limiting example, as shown in FIG. 8B, the roller 200 is moved in a predetermined path including paths P4, P5, P6 and P7, where the paths P4, P5, P6 and P7 independently extend along a column direction and separated from each other by a suitable distance. In some embodiment the paths P4, P5, P6 and P7 are in form of a substantially straight line as view in the plane view of FIG. 8B. The paths P4, P5, P6 and P7 may be arranged in parallel to each other. For another non-limiting example, as shown in FIG. 8C, the roller 200 is moved in a predetermined path including paths P8, P9, P10 and P11, where the paths P8, P9, P10 and P11 independently extend along a row direction and separated from each other by a suitable distance. In some embodiment the paths P8, P9, P10 and P11 are in form of a substantially straight line as view in the plane view of FIG. 8C. The paths P8, P9, P10 and P11 may be arranged in parallel to each other. For another non-limiting example, as shown in FIG. 8D, the roller 200 is moved in a predetermined path including a path P12, where the path P12 extends under each of the semiconductor packages 100 in a meander manner. In some embodiment the path P12 has first portions extending in the column direction and second portions extending in the row direction, where two adjacent first portions are connected through one second portion, and two adjacent second portions are connected through one first portion as view in the plane view of FIG. 8D. The first portions of the path P12 may be arranged in parallel to each other, and the second portions of the path P12 may be arranged in parallel to each other. In other alternative embodiments, the pre-determined path for moving the roller 200 may include any combinations of the paths P1 through P12.

In the embodiments of the semiconductor packages 100 depicted in FIG. 8A through FIG. 8D, the illustrated bottom surfaces of the semiconductor packages 100 include no additional conductive terminals, and thus there is no keep-out zone to the predetermined path of moving the roller 200. However, the disclosure is not limited thereto; alternatively, the semiconductor packages 100 may further a plurality of additional conductive terminals 110 at the illustrated bottom surfaces of the semiconductor packages 100, see FIG. 9A through FIG. 9D.

Figure 9A:
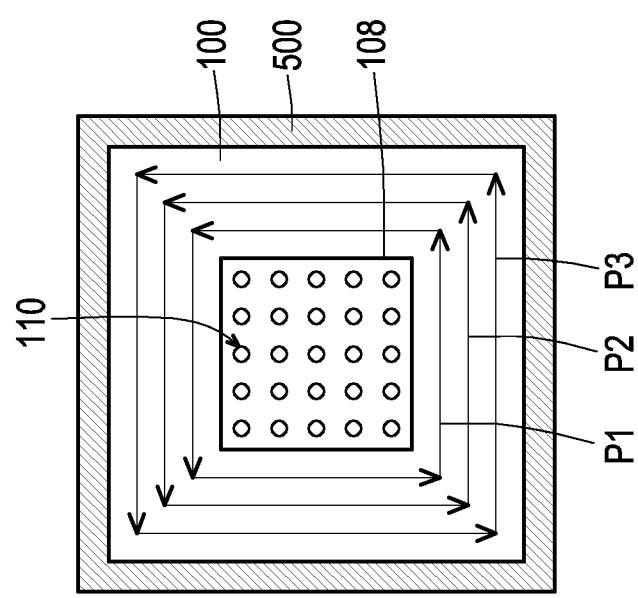
Figure 9D:
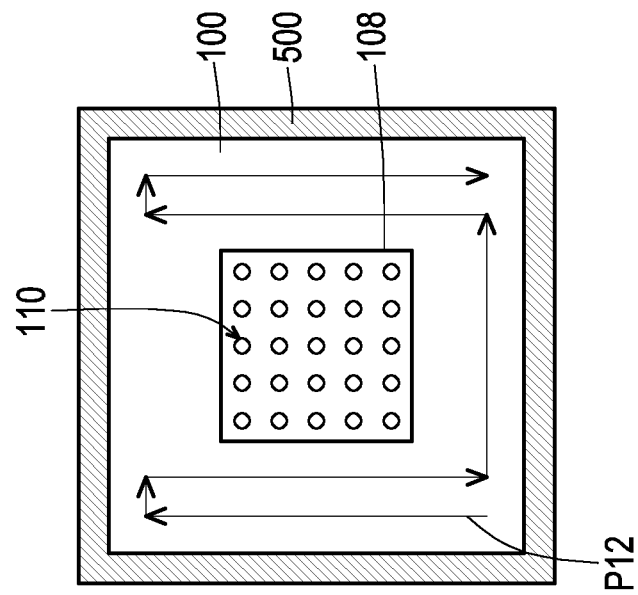
Figure 9C:
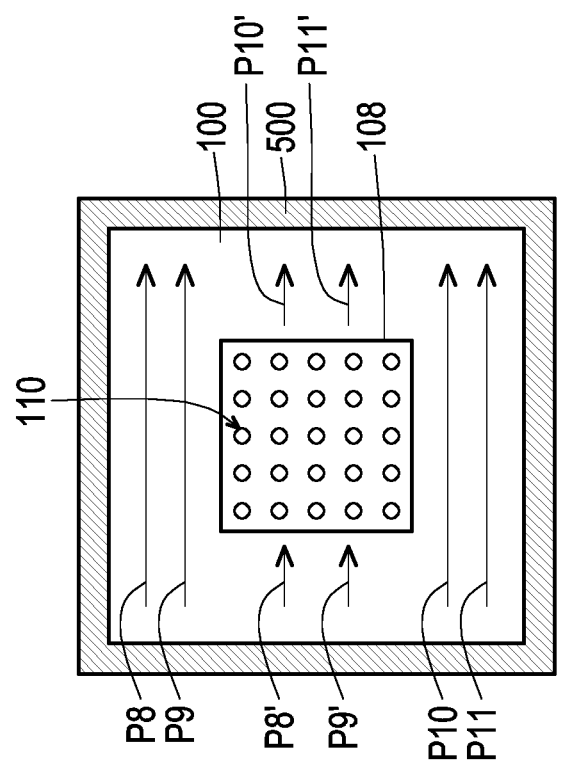

For a non-limiting example, as shown in FIG. 9A, the roller 200 is moved in a predetermined path including paths P1, P2 and P3, where the paths P1, P2 and P3 are distant from a region 108 disposed with the additional conductive terminals 110. In some embodiments, the roller 200 is spaced apart from a closest adjacent additional conductive terminal 110 by a distance being greater than or substantially equal to 200 μm. The details of the paths P1, P2 and P3 have been described in FIG. 8A, and thus are omitted therein. For another non-limiting example, as shown in FIG. 9B, the roller 200 is moved in a predetermined path including paths P4, P5, P6 and P7 in addition with paths P4', P5', P6' and P7', where the paths P4, P4', P5, P5', P6, P6', P7, and P7' are distant from the region 108 disposed with the additional conductive terminals 110. In some embodiments, the roller 200 is spaced apart from a closest adjacent additional conductive terminal 110 by a distance being greater than or substantially equal to 200 μm. The details of the paths P4, P5, P6 and P7 have been described in FIG. 8B, and the details of the paths P4', P5', P6' and P7' are similar to or substantially identical to the details of the paths P4, P5, P6 and P7 as described in FIG. 8B, and thus are omitted therein. For another non-limiting example, as shown in FIG. 9C, the roller 200 is moved in a predetermined path including paths P8, P9, P10 and P11 in addition with paths P8', P9', P10' and P11', where the paths P8, P8', P9, P9', P10, P10', P11, and P11' are distant from the region 108 disposed with the additional conductive terminals 110. In some embodiments, the roller 200 is spaced apart from a closest adjacent additional conductive terminal 110 by a distance being greater than or substantially equal to 200 μm. The details of the paths P8, P9, P10 and P11 have been described in FIG. 8C, and the details of the paths P8', P9', P10' and P11' are similar to or substantially identical to the details of the paths P8, P9, P10 and P11 as described in FIG. 8C, and thus are omitted therein. For another non-limiting example, as shown in FIG. 9D, the roller 200 is moved in a predetermined path including a path P12, where the path P12 is distant from the region 108 disposed with the additional conductive terminals 110. In some embodiments, the roller 200 is spaced apart from a closest adjacent additional conductive terminal 110 by a distance being greater than or substantially equal to 200 μm. The details of the path P12 have been described in FIG. 8D, and thus are omitted therein. The region 1108 may be referred to as a keep-out zone.

In the above embodiments, only one keep-out zone (e.g., the region 108) is presented in each of the semiconductor packages 100, however the disclosure is not limited thereto. The number of the keep-out zone included in each of the semiconductor packages 100 may be selected and designated based on the demand and design requirement. In other alternative embodiments of which the keep-out zone is included, the pre-determined path for moving the roller 200 may include any combinations of the paths P1 through P12 and P4' through P11' as long as the requirement to the distance between the roller 200 and the conductive terminals 110 is fulfilled.

Figure 5:
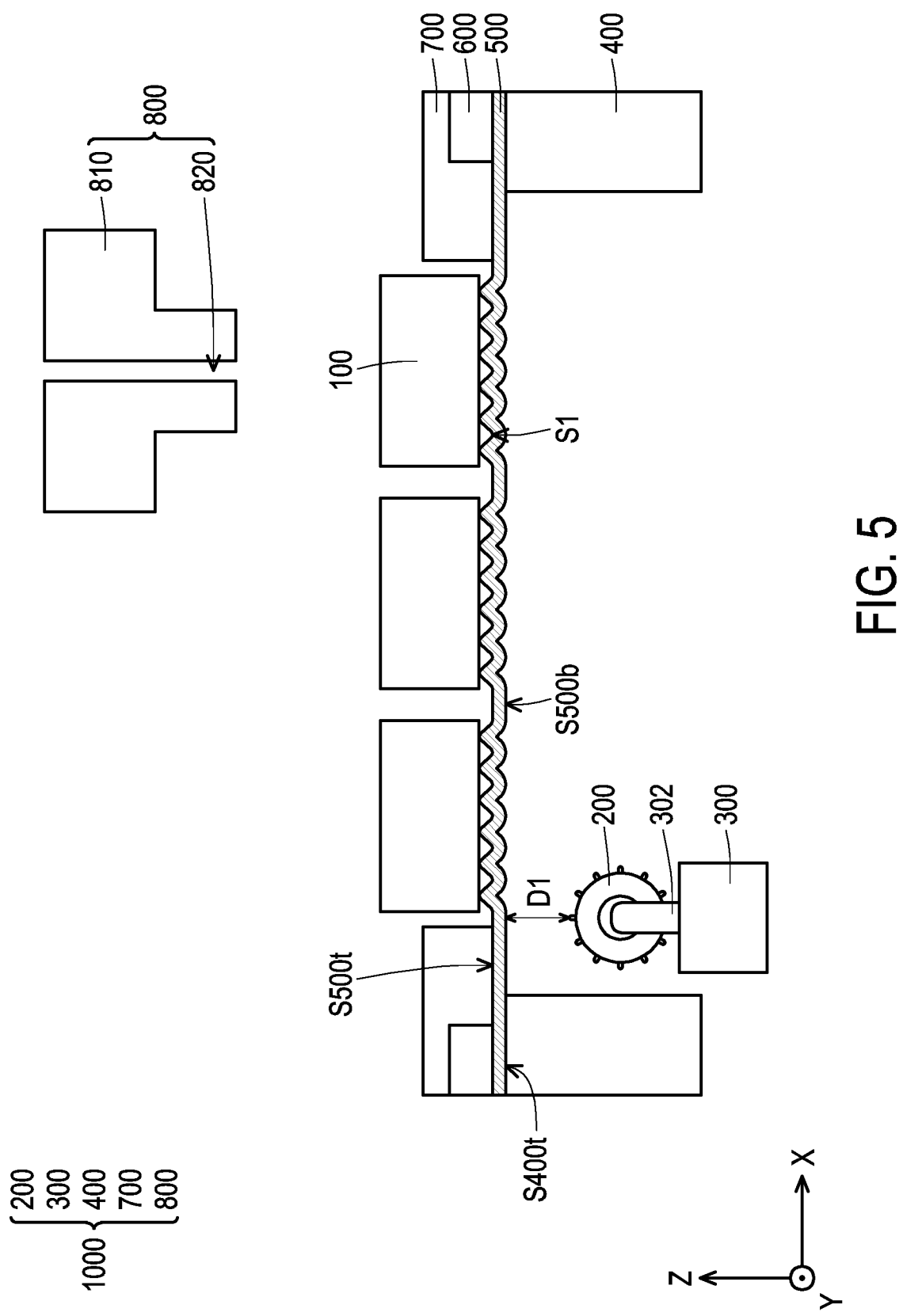

Referring to FIG. 5, in some embodiments, the roller 200 is removed from the holding element 500, in accordance with step S2050 of the method 2000 in FIG. 15. For example, the roller 200 is relocated back to (e.g., moved downwards to) the first configuration, where the roller 200 is disposed at a position vertically distant from (e.g., under) the illustrated top surface S400t of the platform 400 (where the illustrated bottom surface S500B of a non-deformed portion of the holding element 500 located at) by the distance D1. In some embodiments, the collector element 800 is placed over a respective one of the semiconductor packages 100 to-be-picked up. The collector element 800 is overlapped with a respective one of the semiconductor package 100 to-be-picked up along the direction Z in a vertical projection. In some embodiments, the collector element 800 includes a body 810, a channel 820 embedded therein, and a vacuum element (not shown) connected to the channel 820, as shown in FIG. 5. For example, the vacuum element is configured to provide a vacuum force (e.g., generating a negative pressure) to the channel 820 for picking up the semiconductor packages 100. The channel 820 may be referred to as a vacuum path or a vacuum channel. For example, the channel 820 has an opening hole (not labelled) at an illustrated bottom surface of the body 810, where the illustrated bottom surface is facing to the semiconductor packages 100, as shown in FIG. 5. In some embodiments, a material of the body 810 includes a metallic material, such as metal or metal alloy.

Figure 6:
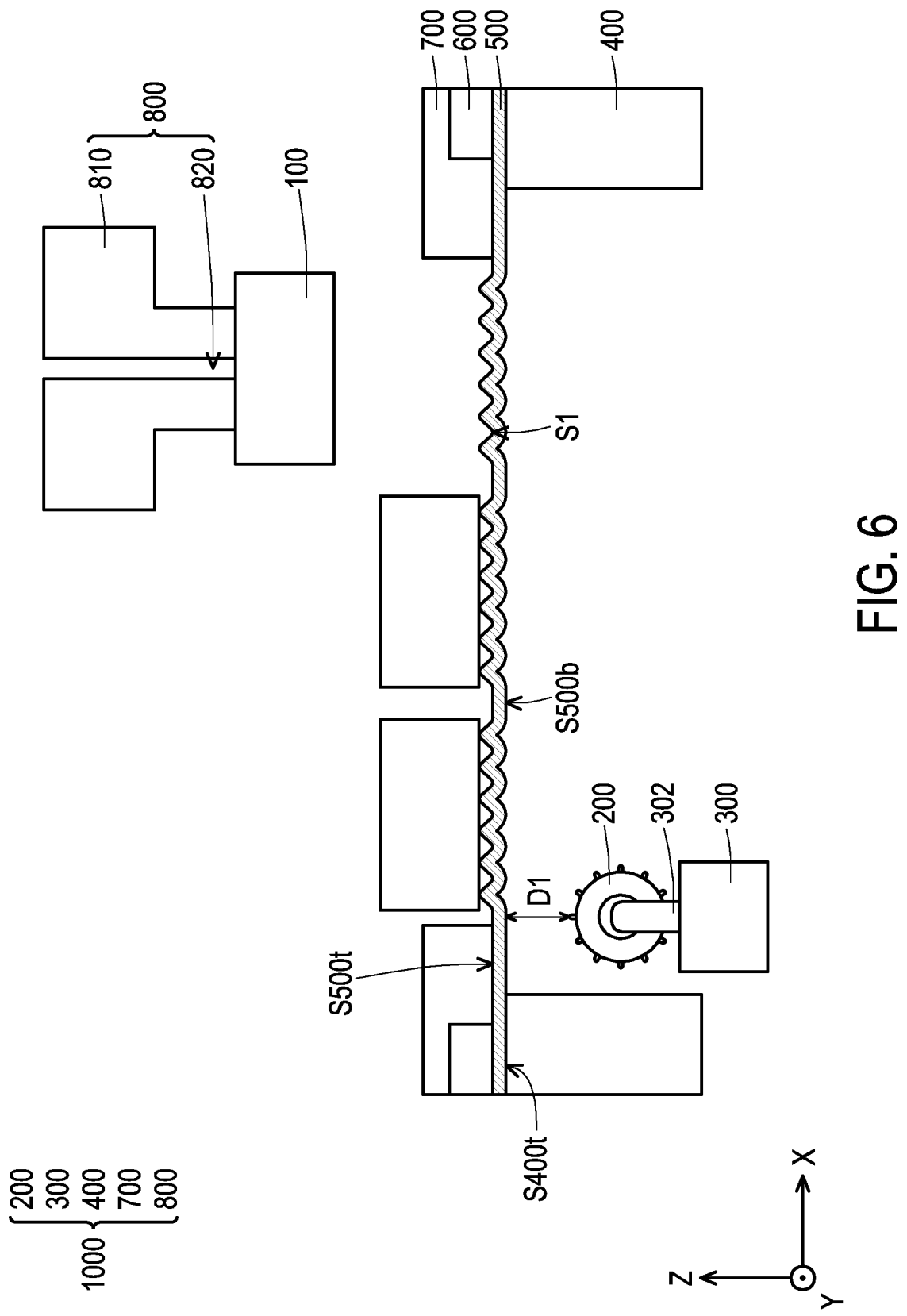

Referring to FIG. 6, in some embodiments, the respective one of the semiconductor packages 100 to-be-picked up is removed from the holding element 500 through the collector element 800, in accordance with step S2060 of the method 2000 in FIG. 15. For example, the collector element 800 is moved downwards along the direction Z until the illustrated bottom surface of the collector element 800 is in (physical) contact with an illustrated top surface of the respective one of the semiconductor packages 100 to-be-picked up, and the collector element 800 applies a vacuum force on the respective one of the semiconductor packages 100 to-be-picked up through the channel 820, such that the respective one of the semiconductor packages 100 to-be-picked up is held by the collector element 800 by a suction force, as shown in FIG. 6. As the respective one of the semiconductor packages 100 to-be-picked up is held by the collector element 800, there is a direct contact therebetween. The collector element 800 may be referred to as a contact mode collector. Thereafter, the collector element 800 is moved upwards along the direction Z, so that the illustrated bottom surface of the respective one of the semiconductor packages 100 to-be-picked up is completely peeled off from the illustrated top surface S1 of the deformed portion of the holding element 500, as shown in FIG. 6, for example.

In some embodiments, the pickup apparatus 1000 further includes a moving mechanism (not shown), where the collector element 800 is connected to the moving mechanism to control the movement of the collector element 800. For example, the moving mechanism is configured to move the collector element 800 vertically along the direction Z and/or horizontally along the direction X and/or Y. The moving mechanism may include a mechanical arm. In some embodiments, the collector element 800 is accurately moved to a position right overlying the respective one of the semiconductor packages 100 to-be-picked up by using an optical microscope (e.g., a detection of an intensity of light reflection of an alignment mark on the respective one of the semiconductor packages 100 to-be-picked up) to determine the location of the respective one of the semiconductor packages 100 to-be-picked up. In other words, the pickup apparatus 1000 may include one or more optical microscopes integrated in the collector element 800 or one or more optical microscopes installed onto the moving mechanism next to the collector element 800. The alignment mark may include one or more metallic patterns formed on or in the respective one of the semiconductor packages 100 to-be-picked up. Although only one collector element 800 is shown to pick up the respective one of the semiconductor packages 100 to-be-picked up during the pick-up process, the number of the collector element 800 used to pick up the respective one of the semiconductor packages 100 to-be-picked up during the pick-up process may be more than one, the disclosure is not limited thereto.

In alternative embodiments, the collector element of the pickup apparatus 1000 may be a contactless mode collector (no shown). That is, as the respective one of the semiconductor packages 100 to-be-picked up is held by such collector element (e.g., the contactless mode collector), there is no direct contact therebetween. Up to here, the pick-up process of the semiconductor packages 100 is performed by the pickup apparatus 1000. The semiconductor packages 100 may be further mounted to a substrate in sequential processes, such as a printed circuit board or the like, the disclosure is not limited thereto.

In accordance with some embodiments, a pickup apparatus for separating a semiconductor package from an adhesive film includes a platform, a roller, a moving mechanism, and a collector element. The platform has a surface disposed with the adhesive film, where the adhesive film is disposed between the platform and the semiconductor package. The roller is disposed inside the platform and under the adhesive film, where the roller includes a body and a plurality of protrusions distributed over the body. The moving mechanism is connected to the roller to control a movement of the roller. The collector element is disposed over the platform and the adhesive film, where the collector element is configured to remove the semiconductor package from the adhesive film.

In accordance with some embodiments, a method for separating a semiconductor package from an adhesive film includes the following steps: providing a pickup apparatus including a platform, a roller disposed inside the platform, and a collector element disposed over the platform, where the roller includes a body and a plurality of protrusions distributed over an outermost surface of the body; placing the semiconductor package adhered on the adhesive film onto the platform of the pickup apparatus; lifting the roller to be in contact with the adhesive film; moving the roller to at least separate first portions of the adhesive film from the semiconductor package; and removing the semiconductor package from second portions of the adhesive film via the collector element.

In accordance with some embodiments, a method for separating a semiconductor package from an adhesive film includes the following steps: providing a pickup apparatus including a platform, a roller disposed inside the platform, a moving mechanism connected to the roller, and a collector element disposed over the platform, where the roller includes a body and a plurality of protrusions distributed over an outermost surface of the body; placing the semiconductor package adhered on the adhesive film onto the platform of the pickup apparatus; moving the roller to be in contact with the adhesive film so as to deform the adhesive film; and removing the semiconductor package from the adhesive film.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A pickup apparatus for separating a semiconductor package from an adhesive film, comprising:

a platform, having a surface disposed with the adhesive film, wherein the adhesive film is disposed between the platform and the semiconductor package;
a roller, disposed inside the platform and under the adhesive film, wherein the roller comprises:
a body; and
a plurality of protrusions, distributed over the body;
a moving mechanism, connected to the roller to control a movement of the roller; and
a collector element, disposed over the platform and the adhesive film, wherein the collector element is configured to remove the semiconductor package from the adhesive film.

2. The pickup apparatus of claim 1, wherein the adhesive film is disposed on the platform through a loading element, the adhesive film is sandwiched between the loading element and the platform, and the pickup apparatus further comprises:

a covering lid, disposed on the platform and engaged with the loading element, wherein the covering lid comprises an opening exposing the semiconductor package, and the loading element is disposed between the adhesive film and the covering lid.

3. The pickup apparatus of claim 2, wherein a sidewall of the opening comprised in the covering lid extends along and separated from a perimeter of the semiconductor package.

4. The pickup apparatus of claim 1, wherein the body of the roller comprises a first end surface, a second end surface and a sidewall connecting the first end surface and the second end surface, the first end surface and the second end surface are opposite to each other, and the sidewall is at least partially facing towards the adhesive film, wherein the plurality of protrusions are disposed on the sidewall of the body.

5. The pickup apparatus of claim 1, wherein each of the plurality of protrusions is pyramid-shaped and has a height ranging approximately from 0.5 mm to 3.0 mm and a width ranging approximately from 0.5 mm to 3.0 mm, and a pitch of the plurality of protrusions ranges approximately from 1.0 mm to 6.0 mm.

6. The pickup apparatus of claim 1, wherein each of the plurality of protrusions is truncated capsule-shaped and has a height ranging approximately from 0.5 mm to 3.0 mm and a width ranging approximately from 0.5 mm to 3.0 mm, and a pitch of the plurality of protrusions ranges approximately from 1.0 mm to 6.0 mm.

7. The pickup apparatus of claim 1, wherein each of the plurality of protrusions is needle-shaped with a rounded tip and has a height ranging approximately from 0.5 mm to 3.0 mm and a width ranging approximately from 0.05 mm to 1.0 mm, and a pitch of the plurality of protrusions ranges approximately from 1.0 mm to 6.0 mm.

8. The pickup apparatus of claim 1, wherein each of the plurality of protrusions is strip-shaped and has a height ranging approximately from 0.5 mm to 3.0 mm and a width ranging approximately from 0.5 mm to 5.0 mm, and a pitch of the plurality of protrusions ranges approximately from 1.0 mm to 3.0 mm.

9. The pickup apparatus of claim 1, wherein the collector element comprises a contact-less mode collector.

10. The pickup apparatus of claim 1, wherein the collector element comprises a contact mode collector.

11. A method for separating a semiconductor package from an adhesive film, comprising:

providing a pickup apparatus comprising a platform, a roller disposed inside the platform, and a collector element disposed over the platform, wherein the roller comprises a body and a plurality of protrusions distributed over an outermost surface of the body;

placing the semiconductor package adhered on the adhesive film onto the platform of the pickup apparatus;

lifting the roller to be in contact with the adhesive film;

moving the roller to at least separate first portions of the adhesive film from the semiconductor package; and removing the semiconductor package from second portions of the adhesive film via the collector element.

12. The method of claim 11, wherein prior to lifting the roller, the method further comprises:

placing a covering lid over the platform to securely hold the adhesive film on the platform of the pickup apparatus, wherein the adhesive film is disposed between the covering lid and the platform, and the covering lid comprises an opening exposing the semiconductor package.

13. The method of claim 12, wherein the adhesive film is placed on the platform by a loading element placed on the platform, and the loading element clamps an edge of the adhesive film, and the covering lid is engaged with the loading element, wherein the loading element is disposed between the covering lid and the adhesive film.

14. The method of claim 11, wherein lifting the roller to be in contact with the adhesive film comprises abutting the plurality of protrusions against the adhesive film so to deform the adhesive film and render the second portions propping against the semiconductor package and the first portions separated from the semiconductor package to form a gap between the first portions of the adhesive film and the semiconductor package.

15. The method of claim 11, wherein removing the semiconductor package from the second portions of the adhesive film via the collector element comprises removing the semiconductor package from the second portions of the adhesive film by the collector element via a contact mode.

16. The method of claim 11, wherein removing the semiconductor package from the second portions of the adhesive film via the collector element comprises removing the semiconductor package from the second portions of the adhesive film by the collector element via a contactless mode.

17. A method for separating a semiconductor package from an adhesive film, comprising:

providing a pickup apparatus comprising a platform, a roller disposed inside the platform, a moving mechanism connected to the roller, and a collector element disposed over the platform, wherein the roller comprises a body and a plurality of protrusions distributed over an outermost surface of the body;

placing the semiconductor package adhered on the adhesive film onto the platform of the pickup apparatus;

moving the roller to be in contact with the adhesive film so as to deform the adhesive film; and removing the semiconductor package from the adhesive film.

18. The method of claim 17, wherein:

moving the roller to be in contact with the adhesive film so as to deform the adhesive film comprises:

moving the roller to be in contact with the adhesive film in a vertical direction through the moving mechanism; and moving the roller with a pre-determined path in a horizontal direction so as to at least separate first portions of the adhesive film from the semiconductor package along a plane perpendicular to the vertical direction through the moving mechanism to reduce an adhesion between the adhesive film and the semiconductor package, wherein the pre-determined path spans across an occupying area of the semiconductor package, and removing the semiconductor package from the adhesive film comprises:

removing the semiconductor package from second portions of the adhesive film via the collector element, wherein the first portions and the second portions are connected to one another.

19. The method of claim 18, wherein the semiconductor package comprises a region disposed with a plurality of conductive terminals, and the conductive terminals are in contact with the adhesive film, wherein the pre-determined path spans across an occupying area of the semiconductor package without the region.

20. The method of claim 17, wherein the body of the roller comprises a first end surface, a second end surface and a sidewall connecting the first end surface and the second end surface, the first end surface and the second end surface are opposite to each other, and the sidewall is at least partially facing towards the adhesive film, wherein the plurality of protrusions are disposed on the sidewall of the body, and each of the plurality of protrusions includes a geometry of a pyramid, a truncated capsule, a needle with a rounded tip, or a strip having a cross-section of triangle, wherein a height of each of the plurality of protrusions is ranging approximately from 0.5 mm to 3.0 mm.

* * * * *